US 6,687,168 B2

(12) United States Patent
Fischer (10) Patent No.: US 6,687,168 B2
(45) Date of Patent: Feb. 3, 2004

(54) METHOD FOR WRITING DATA BITS TO A MEMORY ARRAY

(75) Inventor: Michael Christian Fischer, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 98 days.

(21) Appl. No.: 10/053,995

(22) Filed: Jan. 18, 2002

(65) Prior Publication Data

US 2003/0137891 A1 Jul. 24, 2003

(51) Int. Cl.[7] .................................................. G11C 7/00
(52) U.S. Cl. ............................. 365/189.11; 365/225.7; 365/207
(58) Field of Search ....................... 365/225.7, 189.11, 365/207

(56) References Cited

U.S. PATENT DOCUMENTS

| 5,173,873 | A | | 12/1992 | Wu et al. |
| 5,748,519 | A | | 5/1998 | Tehrani et al. |
| 5,969,403 | A | | 10/1999 | Fournel et al. |
| 6,452,851 | B1 | * | 9/2002 | Endo et al. ................. 365/205 |
| 2001/0048608 | A1 | | 12/2001 | Numata et al. |
| 2002/0018359 | A1 | * | 2/2002 | Mizuno et al. ............. 365/154 |

* cited by examiner

*Primary Examiner*—Michael S. Lebentritt
*Assistant Examiner*—Nam Nguyen

(57) ABSTRACT

A method of writing data bits to a memory array. In one method embodiment, a first input is received. This causes an application of high power, via a sense line, to an addressed bit in the memory array and causes a write operation to be applied to the addressed bit. A second input is received. This causes an application of low power, via said sense line, to the addressed bit and causes a read operation on the addressed bit. The sense line is used to read and write the addressed bit.

16 Claims, 9 Drawing Sheets

METHOD FOR WRITING DATA BITS TO A MEMORY ARRAY

TECHNICAL FIELD

The present invention relates to a method and apparatus for writing data bits to a memory array.

BACKGROUND ART

In nearly every electronic and computer device and/or system, there are memory components and elements which are used in conjunction with the storing of data/information. This data/information may be, but is not limited to, operating system instructions, currently used data, or data that is to be archived and retained within a memory component or data storage device, and the like.

To provide for the storage of data that is to be archived, non-volatile data storage devices were developed to provide data storage. Permanently stored data, commonly termed archived data, only needs to be written once to memory, and can then be read many times. One example of memory that can provide data storage is commonly referred to as WORM (write once read many) memory. Another example of memory that can provide data storage is rewriteable memory.

Unfortunately, previous data storage devices such as hard disks, floppies, and CD-RWs, etc., are now commonly larger in size than many of the handheld computer systems and digital devices so prevalent today.

Accordingly, to provide data storage for the more diminutive computers and digital devices, newer and smaller sized data storage devices have been developed. Further, these newer data storage devices need to have storage capacities sufficient for the storing for digital images and digital audio.

One such data storage device recently developed is flash memory. One form of flash memory is that which is compatible with PCMCIA standards. Another form of flash memory is that which is compatible with a Compact Flash card standards. In yet another form, the flash memory is very similar in function to a miniature floppy disk, but with a much greater storage capacity. A floppy disk has a capacity of 1.44 MB (megabytes) whereas this form of flash memory can have a capacity that ranges from 8 MB up to 128 MB, or more, of storage space, which is more than adequate for most images, audio files, and/or the archiving of data. This type of flash memory is commonly referred to as an SD (secure digital) card, an MMC (multi-media card), or a memory stick. This type of flash memory is becoming more and more prevalent in today's electronic devices, e.g., digital cameras, printers, MP3 players, PDA's, and the like.

The memory section of the flash memory is called the array, or a crosspoint array, or a crosspoint matrix. A crosspoint array or matrix is an arrangement of signal circuits in which input buses are represented by vertical parallel lines and output buses are represented as overlapping horizontal parallel lines. Crosspoint switches at each of the intersecting points connect the inputs with the outputs. Within the crosspoint array, there are a multitude of memory cells. The number of memory cells is dependent upon the size of the array, and can range from as few as a couple of hundred to millions or billions of memory cells. For an electronic device/system and/or a computer system to utilize the memory cells within a memory component, there exists a necessity to be able to read and write data bits to and from the memory cell.

It is commonly known that the writing of data bits can be accomplished by a switching of the power supply voltage to a substantially higher level. While this increase in power supply voltage does, in fact, enable the writing of data bits, it is not without certain drawbacks. Because of the need to increase the power supply voltage to provide data bit writing functionality, numerous ways to provide the increased power supply voltage have been attempted.

In one example, an additional power supply, separate from the first power supply, is implemented. The additional power supply uses a portion of the remaining critical real estate within the electronic device and additional power is needed to operate the additional power supply. While the additional power supply enables data bit writing, by having to account for and to accommodate the power supply within the electronic device, the size of electronic device into which it would be placed may have to be increased, which can add to the overall cost of the device. Further, because the additional power supply requires additional power for it to operate, it may have a detrimental effect upon the capacity of the first power supply. This is especially critical in those electronic devices where the power is derived from batteries or rechargeable power sources. By requiring additional power from the limited retained energy source to power both power supplies, battery replacement or recharging can become more frequent.

In another attempt, a means to significantly change the output of a single power supply is implemented. This is accomplished through the addition of a variety of components and related circuitry, such as amplifiers, transistors, diodes, and the like. While enabling data bit writing, it would, by virtue of the inherent propagation delays within each of the additional components, be a slow-responding process. Additionally, the increase in required real estate to accommodate the added components and circuitry could negatively impact the size of the electronic device. Further, in most cases, the additional components and circuitry would require additional power to be provided to ensure their proper operation. As such, in electronic devices and computer systems that operate on batteries or a rechargeable power source, this could cause an increase in the frequency with which the batteries are replaced or the power source is recharged.

Further, during the writing process, it is common to apply power to the entire crosspoint array. While writing, power is being unnecessarily wasted as only some of the memory cells within the array are written to at any one time. As such, when writing to an array in this manner, where the electronic device or computer system is powered by a battery or a rechargeable power source, this power waste may cause an increase in the frequency with which battery or the rechargeable power source is replaced or recharged, respectively.

Thus, it would be beneficial to be able to write a data bit to a cell in a memory array where additional power sources are not required. It would also be beneficial to use existing components and circuitry when writing to a memory array. It would be further beneficial to write to a cell in a memory array where power is applied to those portions of the array to which the data bit is being written.

DISCLOSURE OF THE INVENTION

Therefore, embodiments of the present invention are drawn to providing a method and apparatus for writing data bits to a memory array.

In one method embodiment, a first input is received. This causes an application of high power, via a sense line, to an addressed bit in the memory array and causes a write operation to be applied to the addressed bit. A second input is received. This causes an application of low power, via said sense line, to the addressed bit and causes a read operation on the addressed bit. The sense line is used to read and write the addressed bit.

In one embodiment, the present invention provides a circuit for writing data bits to a memory array comprising a power source for providing voltage potential and current to said circuit and coupled thereto, an input line for receiving inputted data bit values is coupled to a logic inverter, a plurality of first transistors having first leads coupled to the input line, a plurality of second transistors having first leads coupled to an output of the logic inverter, a plurality of sense lines coupled to other leads of the first and the second plurality of transistors and coupled to the memory array, a plurality of sense amplifiers coupled to other leads of the first and the second plurality of transistors, and a plurality of address lines coupled to the memory array and coupled to the sense lines enabling writing of said data bit to an addressed bit of said memory array.

BRIEF DESCRIPTION OF THE DRAWINGS

The accompanying drawings, which are incorporated in and form a part of this specification, illustrate embodiments of the invention and, together with the description, serve to explain the principles of the invention.

MODE(S) FOR CARRYING OUT THE INVENTION

A method and apparatus for writing data bits to a memory array is described. In one embodiment, the memory array is a cross-point diode memory array. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

The present invention is discussed primarily in the context of writing data bits in a memory array of a data storage device such as a flash memory unit, which can be used in conjunction with a handheld, portable, desktop, or workstation computer system. However, it is appreciated that embodiments of the present invention are well suited to be implemented and used with other types of memory arrays that can be utilized in other electronic devices, e.g., digital cameras, digital video cameras, MP3 players, portable CD players, and the like. It should be further be appreciated that the present invention is also well suited for use in other electronic devices such as printers, electronic books, and the like. In fact, embodiments of the present invention are well suited to be utilized with nearly any memory array of nearly any electronic or computer device and/or system that is configured with write-once memory functionality and/or rewriteable memory functionality.

It should be appreciated that the acronym PIRM, which represents the term permanent inexpensive rugged memory, will be used throughout this disclosure. It is further appreciated that the term permanent, in the acronym PIRM, refers to memory that is permanent until changed.

It should also be appreciated that in the following disclosure, the term "data" may represented in a variety of ways, dependent upon the context thereof. In one example, in a memory cell, data may represent a voltage level, a magnetic state, or an electrical resistance. In another example, during transmission, data may represent an electrical current or a voltage signal. Additionally, data may represent what is primarily binary and for convenience, may be equated to states of zero (0) and one (1). It should, however, be appreciated that the binary states may represent different voltages, currents, resistances, or the like.

It should be further appreciated that the term, layer electronics, in this disclosure, is used to describe all the functions in addition to the basic cross-point memory that are performed on the PIRM layers. These functions include de-multiplexing (addressing), multiplexing (sensing), and the write-enable function. The processes of fabricating a PIRM and the related layer electronics are described in more detail in the co-pending U.S. patent application Ser. No. 09/875,572, entitled "Fabrication Techniques for Addressing Cross-Point Diode Memory Arrays", by C. Taussig and R Elder, and which is hereby incorporated by reference.

The process of addressing and sensing of a cross-point diode memory array of a PIRM is described in more detail in co-pending U.S. patent application Ser. No. 09/875,496, entitled "A Method of Addressing and Sensing a Crosspoint Diode Memory Array," by C. Taussig and R Elder, and which is hereby incorporated by reference.

In another embodiment, a cross-point diode memory array may be accessed in a parallel manner. The process of parallel accessing of a cross-point diode memory array is described in more detail in the co-pending U.S. patent application Ser. No. 09/875,828, entitled "Parallel Access of Cross-Point Diode Memory Arrays", by C. Taussig and R. Elder, and which is hereby incorporated by reference.

Figure 1:
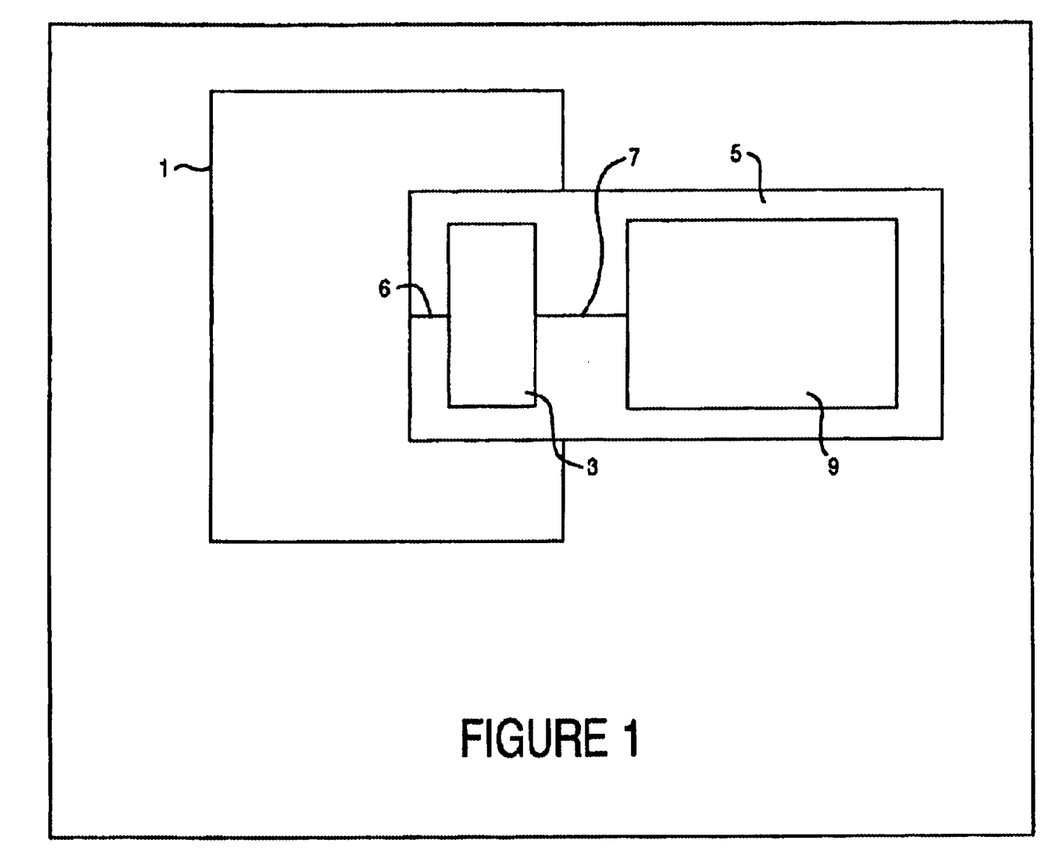
FIG. 1 is a block diagram of a data storage device configured with an interface card which is insertable in an electronic device, in accordance with one embodiment of the present invention.

FIG. 1 shows an illustrated block diagram of a PIRM (permanent inexpensive rugged memory) 9 upon which embodiments of the present invention may be practiced. In the present embodiment, PIRM 9 is shown to be removeably coupled to an industry standard interface card 5. In one embodiment, interface card 5 is a PCMCIA card. In another embodiment, interface card 5 is a Compact Flash card. Interface card 5 is shown, in one embodiment, to be removeably coupled to device 1 via bus 6. Bus 6 provides a communication pathway between device 1 and interface card 5. In one embodiment, interface control circuit 3 is coupled with bus 6 and PIRM 9 via internal bus 7. Internal bus 7 provides a communication pathway between interface control circuit 3 and PIRM 9. Interface control circuit 3 comprises controlling, interfacing, detecting, and error correction coding (ECC) circuitry, and the like, for each PIRM 9 when it is received in interface card 5. PIRM 9 provides circuitry for write-to data storage, which includes some detection, write enabling, and addressing functions.

Figure 2:
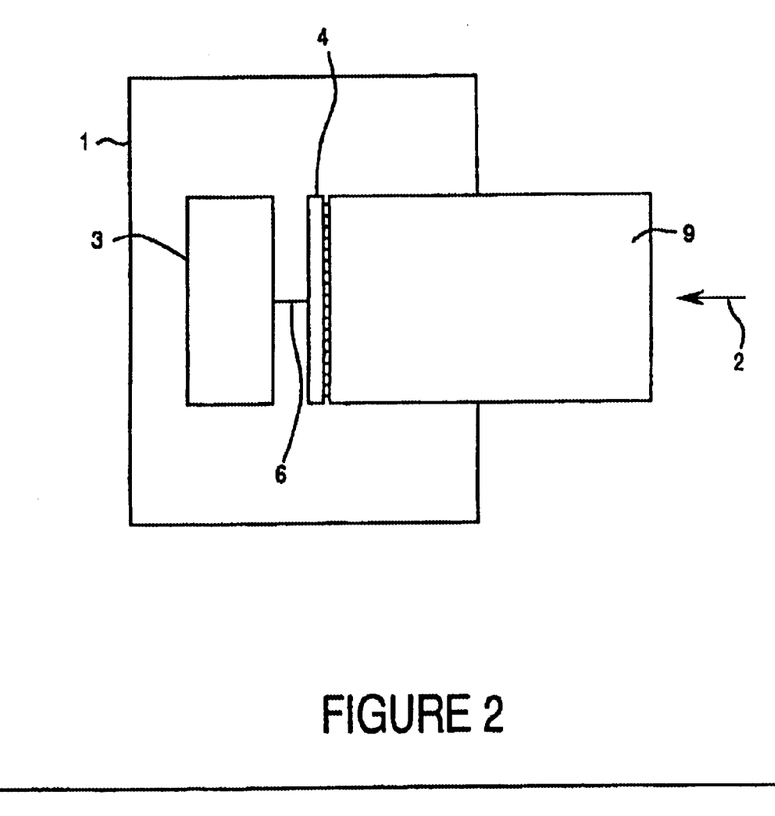
FIG. 2 is a block diagram of a data storage device configured as insertable into a receiving slot of an electronic device, in accordance with one embodiment of the present invention.

FIG. 2 shows a PIRM 9, upon which embodiments of the present invention may be practiced, removeably coupled to a device 1 via an interface connector 4, in another embodiment of the present invention. In one embodiment, PIRM 9 is adapted to be inserted into device 1 in a direction as indicated by arrow 2. PIRM 9 is analogous to PIRM 9 of FIG. 1. Device 1 is shown to have disposed therein interface control circuit 3 which is communicatively coupled thereto and coupled to interface connector 4 via bus 6. It should be appreciated that interface control circuit 3 is analogous to interface control circuit 3 of FIG. 1. Bus 6 provides a communication pathway between interface control circuit 3 and interface connector 4. PIRM 9 is adapted to be removeably coupled to interface connector 4, when a PIRM 9 is received by device 1 through a slot or opening disposed upon an external surface thereof. In another embodiment, PIRM 9 may be coupled to device 1 via a interface cable, e.g., a serial cable, a IEEE 1394 Firewire, a USB cable, and the like.

Still referring to FIG. 2, some newer printers, digital cameras, and handheld computer systems are configured with external slots which are adapted to receive digital storage devices, such as PIRM 9 that is shown as inserted into device 1. Accordingly, utilizing this type of digital data storage to exchange data or information between devices so equipped is a simple and easy process. In one embodiment, PIRM 9 is configured as an SD (secure digital) card. In another embodiment, PIRM 9 is configured as an MMC (multi media card).

It should be appreciated that write-once memory means that data can be effectively written to the memory once, and nearly unchangeable thereafter. For example, many examples of write-once memories are originally set at first binary state, which may be represented by a binary data value of zero (0). During a write process, writing to selected memory cells will change the first binary state to a second binary state, represented by a binary value of one (1). Commonly, once the selected memory cells are changed from a first state (0) to a second state (1), that change in state cannot be reversed. Conversely, if a memory cell has not been changed from a zero to a one, then that memory cell may have its state altered at a later time. However, because of the previous writing which altered selected memory cells, remaining memory cells still in the first state may not be arbitrarily changed.

It should be further appreciated that rewriteable memory means that the memory may be written to, and then re-written many times. Unlike RAM (random access memory), a type of rewriteable memory, the rewriteable memory described in the following does not lose its data when unpowered.

Figure 3:
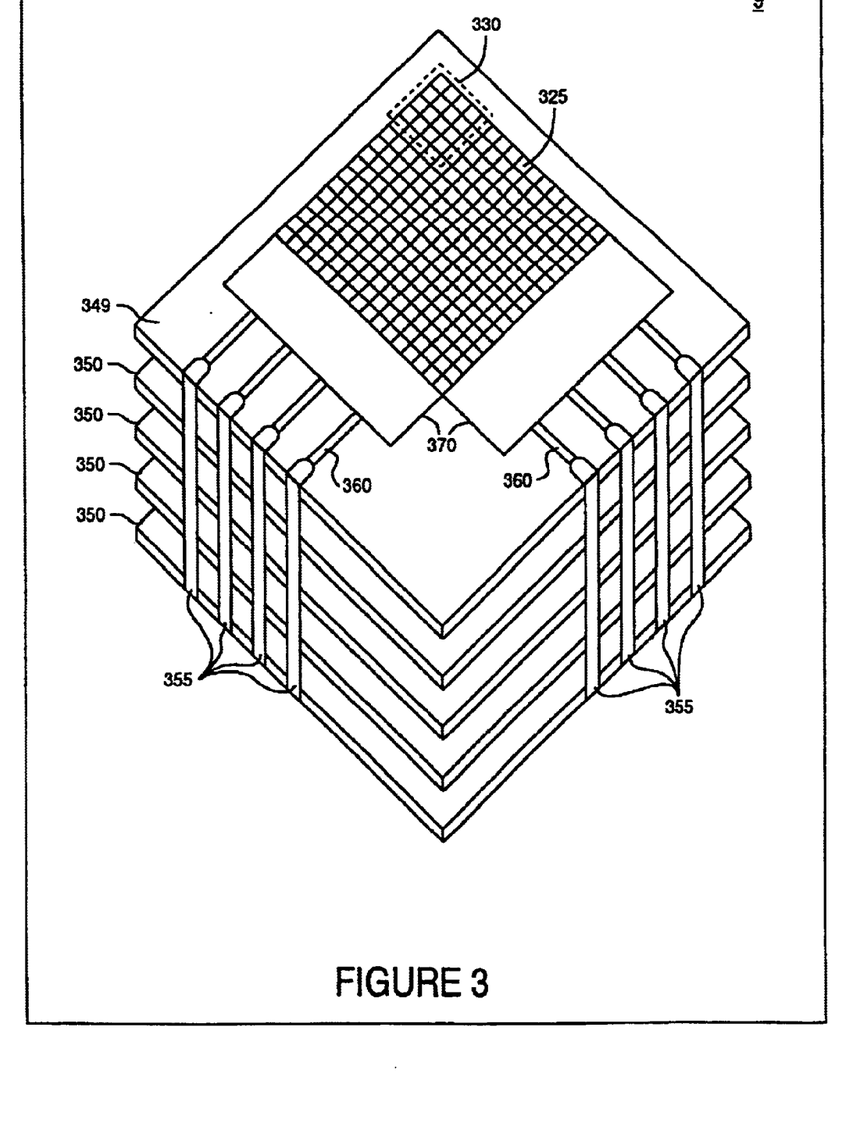
FIG. 3 is an illustrated perspective of a memory array of a data storage device, in accordance with one embodiment of the present invention.

FIG. 3 is an illustration showing a PIRM 9, in one embodiment of the present invention. The top layer 349 shows a cross-point diode memory array 325, coupled with addressing circuits 370. Addressing circuits 370 are coupled with input/output (I/O) leads 360 which terminate at the edge of the substrate of each layer and are coupled to contact elements 355 thereby effectively connecting each additional layer 350. Each additional layer 350 has disposed upon the substrate a cross-point diode memory array 325, addressing circuits 370, and I/O leads 360.

Still referring to FIG. 3, shown also is an array 330, a portion of cross-point diode memory array 325 of layer 349. Array 330 will be more thoroughly shown and described in FIG. 4.

It should be appreciated that although FIG. 3 depicts five layers, this only to more clearly illustrate the components and circuitry disposed upon each layer, and should not be construed as a limitation to the number of layers that may comprise a cross-point memory.

Figure 4:
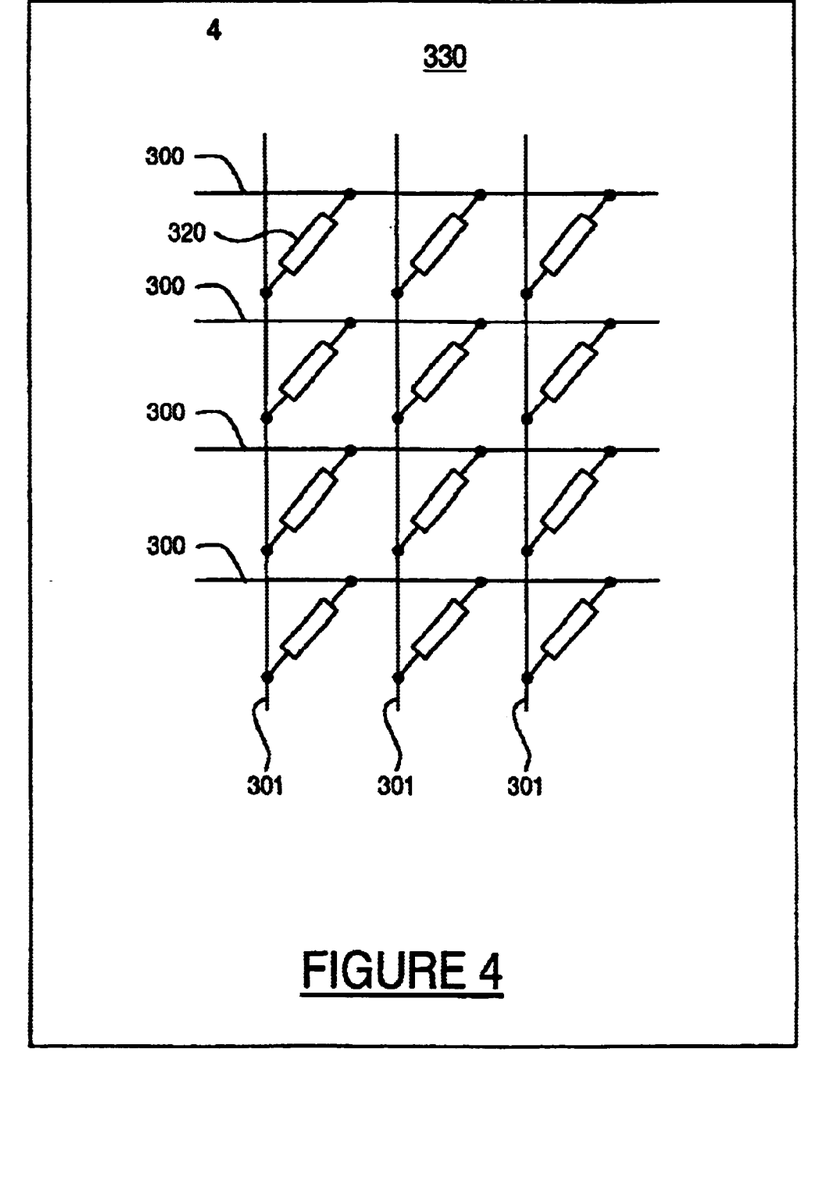
FIG. 4 is an illustrated schematic diagram of a portion of the memory cells of the memory array of the data storage device of FIG. 3.

FIG. 4 is an exploded view of array 330 of cross-point diode memory array 325 of FIG. 3. Array 330 comprises a matrix of row lines 300 and column lines 301 with a memory element/cell 320 at the row/column intersections. Memory element/cell 320 is at the intersection of exactly one row and one column line and is shown is greater detail in FIG. 5

Figure 5:
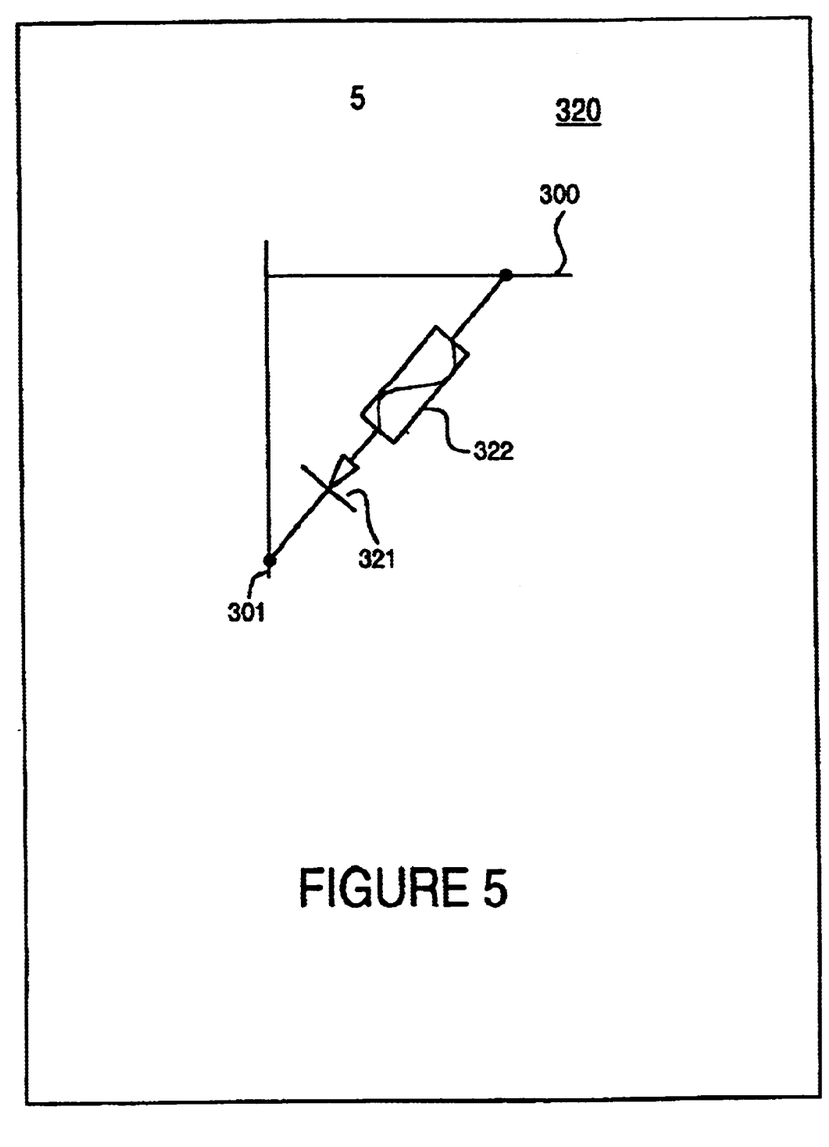
FIG. 5 is an illustrated schematic diagram of a single memory cell of the memory array of FIG. 3 and FIG. 4.

FIG. 5 is an expanded illustration of memory element/cell 320. Memory element/cell 320 is shown to be comprising a fuse element 322 coupled in series to a memory element/cell diode 321. The fuse element 322 provides the actual data storage effect of the memory element 320. Diode 321 facilitates the addressing of the memory element/cell 320 by utilizing row lines 300 and column lines 301.

In one embodiment of the present invention, the operation of memory element/cell 320 is as follows. Subsequent to fabrication of memory elements 320, each memory element 320 has a fuse element 322 which is conductive. The conductive state of fuse element 322 is representative of a first binary state, such as a data value of zero (0). To write to memory array 325, each memory element/cell 320 in which it is desired to store a second binary state, such as a data value of one (1), is addressed utilizing row and column lines and fuse element 322 is thereby blown, placing it in a non-conductive state. Blowing fuse element 322 is, in most circumstances, a non-reversible process, which makes memory array 325 a write-once data storage, as discussed above. Writing to memory element/cell 320 can be accomplished by applying a predetermined energy to memory element 320 via a selected row line 300 and a selected column line 301. It should be appreciated that the energy being applied to memory element/cell 320 must be sufficient to blow the fuse element 322 which intersects the selected row and column lines.

In another embodiment of the present invention, while the above description utilizes a fuse element 322 which is fabricated in a low-resistance state and subsequently, when written to, is altered to a high-resistance state, it is equivalently possible to provide a memory element 320 which utilize an anti-fuse. An anti-fuse operates conversely to a fuse. An anti-fuse is, at fabrication, in a high-resistive state and blown to create a low-resistive state. The anti-fuse in each memory element 320, when memory element 320 is so configured, is also formed in series with a memory element diode 321, whose function is necessary subsequent to the blowing of the anti-fuse.

It should be appreciated that embodiments of the present invention can be readily utilized with alternative fuses that are configured for utilization as both a fuse and an anti-fuse. This type of fuse can written to many times, e.g., changing from a fuse to an anti-fuse and back again to a fuse, as required.

It should be appreciated that during the reading of bit values, 1 or 0, the reading must be gentle enough so as not to cause a change in the state of the bit. It should further be appreciated that when writing data bits, it is necessary to ensure that there is sufficient voltage/power/current to ensure the proper state of the data bit. In one embodiment, sense lines, e.g., sense lines 302 and 303 (FIG. 6) are utilized to read the state of the addressed bit, as well to change the state of the bit, as when writing to the addressed bit.

Figure 6:
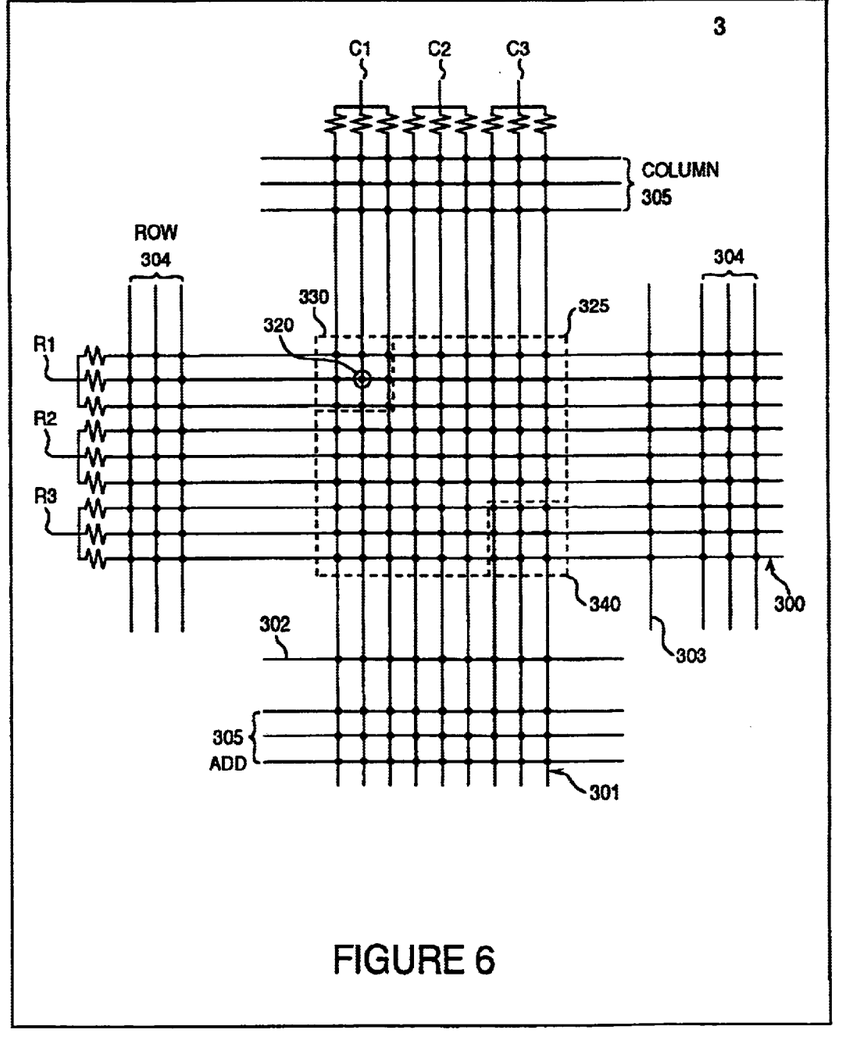
FIG. 6 is an illustrated circuit diagram of a memory array, in accordance with one embodiment of the present invention.

FIG. 6 is an illustrated schematic diagram of a memory circuit wherein a cross-point memory array 325 is disposed, as shown in FIG. 3. In one embodiment of the present invention, writing data bits to a memory element 320 within a cross-point diode memory array 325 is implemented while providing power conservation.

Still referring to FIG. 6, cross-point memory array 325 is formed by a matrix of row lines (electrodes) 300 and column lines (electrodes) 301. The row lines 300 and column lines 301 extend from cross-point diode memory array 325 through row address lines (circuitry) 304, row sense line 303, column address lines (circuitry) 305, and column sense line 302, respectively, in one embodiment of the present invention. In one embodiment, column lines 301 are arranged such that the power connections to the ends of column lines 301 are in stripes (groups of, e.g., three) and are labeled C1, C2, and C3, respectively. In one embodiment, row lines 300 are arranged such that the power connections to the ends of the row lines are in stripes (groups of e.g., three) and are labeled R1, R2, R3, respectively. Therefore, when writing to a memory cell, for example memory element/cell 320 within sub array 330, only those row and column lines within the appropriate stripe are to receive power. Accordingly, in this example, when writing to memory cell 320 which is in sub array 330, only row stripe R1 and column stripe C1 receive power such that only sub array 330, which contains memory element 320, is energized.

It should be appreciated that had another memory element disposed, for example, in sub array 340, in the lower right corner of cross-point memory array 325, then only row stripe R3 and column stripe C3 would receive power such that R3 and C3 would be energized. It should be further appreciated that by only activating those stripes which contain the memory elements to which the writing of a data bit is directed, a substantial reduction in power consumption is realized.

Figure 7:
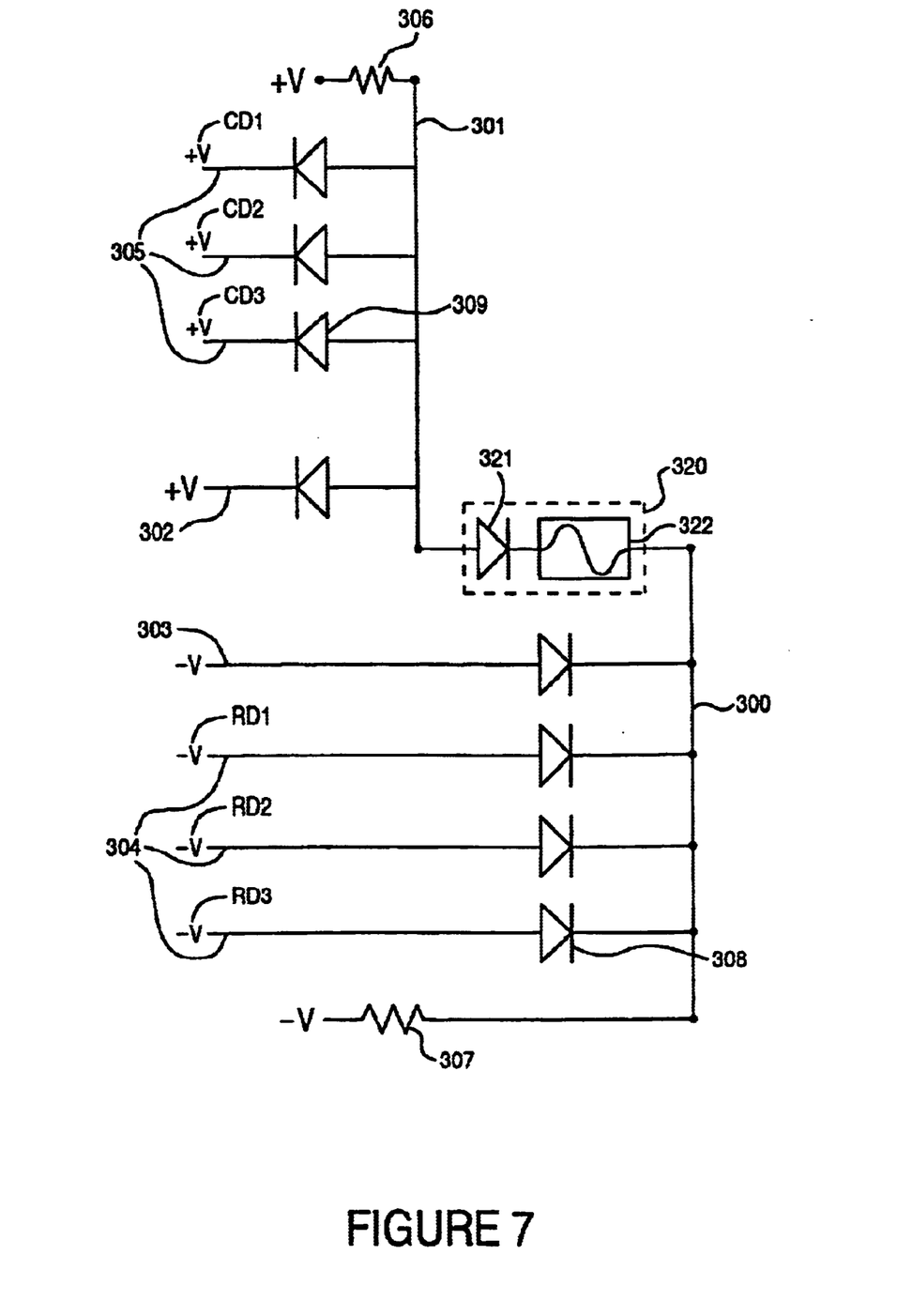
FIG. 7 is an illustration of a memory array addressing circuit, in accordance with one embodiment of the present invention.

FIG. 7 is an illustrated schematic diagram of a portion of a write-to memory array 325 of which memory element 320 is part. Memory element 320, which comprises fuse element 322 and diode 321 as shown in FIG. 5, is coupled between a row line 300 and a column line 301. Row address lines 304 are coupled to row lines 300 at appropriate points through addressing decoding diodes, and column address lines 305 are coupled to column lines 301 in an analogous manner. Resistor 306 is interposed between column line 301 and pull-up voltage, +V, and coupled therewith. Resistor 307 is interposed between row line 301 and pull-down voltage, −V, and coupled therewith. Row address lines 304 are coupled to a plurality of row address diodes 308. Row address diodes 308 have their anodes coupled to the row address line 304 and their cathodes coupled to row lines 300 and are controlled by the voltage of the row address lines 304. Column address lines 305 are coupled to a plurality of column address diodes 309. Column address diodes 309 have their cathodes coupled to column address lines 305 and their anodes are coupled to column lines 301, and are controlled by the voltage of column address lines 305.

Still with reference to FIG. 7, column electrode 301 is high only when column address input voltages CD1, CD2, and CD3 are high (+V). Row electrode 300 is low only when row address input voltages RD1, RD2, and RD3 are low (−V). Therefore, when row address inputs RD1, RD2, and RD3 all apply anode voltages of −V to the diodes 308 and column address inputs CD1, CD2, and CD3 all apply cathode voltages of +V to diodes 309, then memory element 320 is selected. It should be appreciated that although only three-input circuits are shown in FIG. 7, this writing scheme can be expanded to include either a larger or smaller number of inputs.

Referring still to FIG. 7, it should also be appreciated that if any one of the row address diodes is connected to a voltage near +V, then regardless of the state of the column address diodes, the memory element will not be forward biased. Similarly, if any one of the column address diodes is connected to a voltage near −V, then the memory cell cannot be forward biased.

Figure 8:
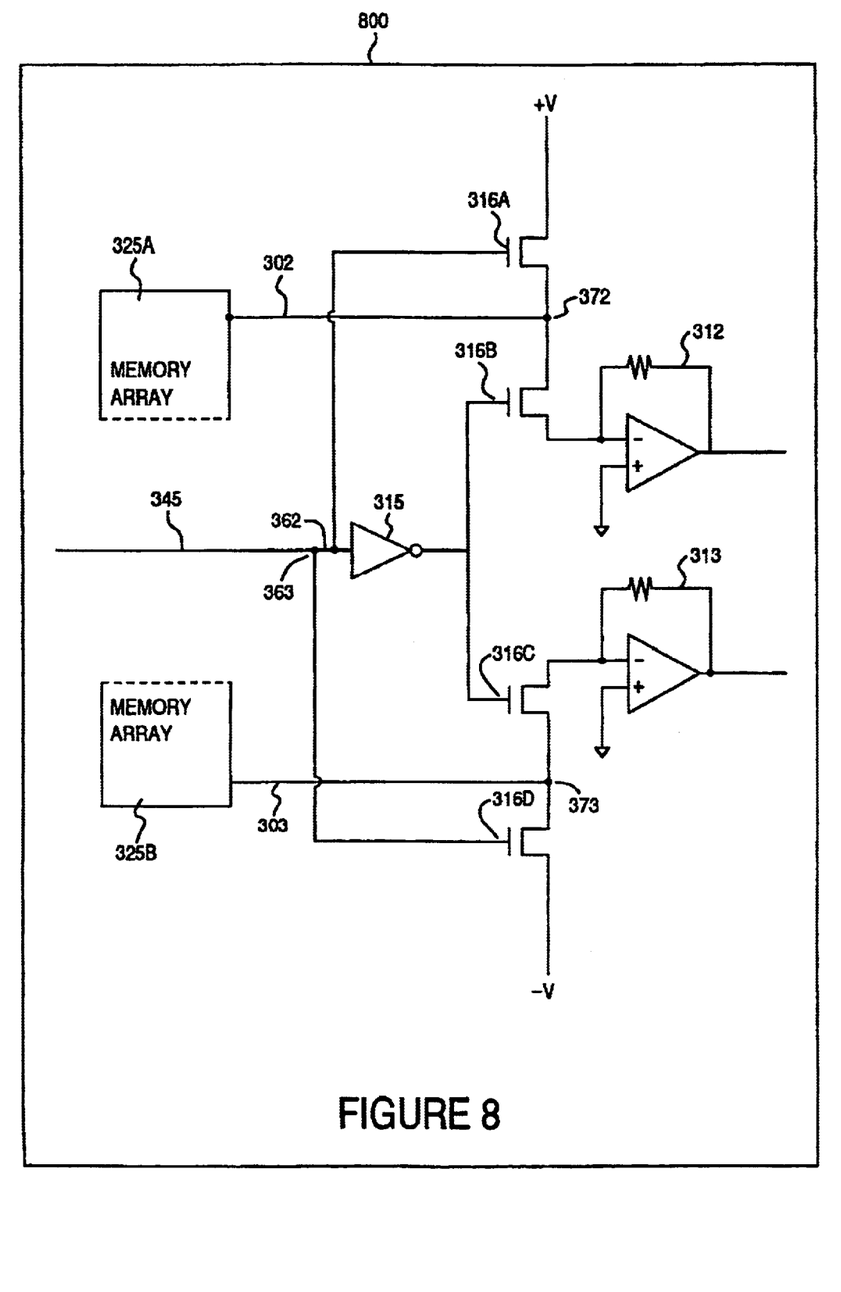
FIG. 8 is an illustrated schematic diagram of a circuit for writing a data bit, in accordance with one embodiment of the present invention.

FIG. 8 is an illustrated schematic diagram of writing circuit 800 which can be implemented in writing data bits to a PIRM memory, in one embodiment of the present invention. Memory array portions 325A and 325B, respectively, represent the column and row portions of a memory array 325. Data bit input line 345, which contains the data bit to be written and is coupled to the input of logic inverter 315, is shown to be coupled to transistor 316A via node 362 and coupled to transistor 316D via node 363. Logic inverter 315 has its output coupled to transistors 316B and 316C. In one embodiment, transistors 316A–D are MOS (metal oxide semiconductor) transistors. In another embodiment, transistors 316A–D may be of another transistor type, provided that the different transistor type provides functionality analogous to a MOS type transistor. In the present embodiment, transistors 316A–316D are equivalent.

Still referring to FIG. 8, transistor 316B is shown as having an electrode coupled to an input of column sense amplifier 312. Transistor 316C is shown to have one electrode coupled to an input of row sense amplifier 313. Row sense amplifier 313 is shown to be coupled in negative feedback. Column sense amplifier 313 is also shown to be coupled in negative feedback.

Referring still to FIG. 8, when a data bit having a binary value of one (1) is to be written to a memory element, e.g., memory element 320 of FIG. 7, via data bit input line 345, the inputted binary value of one (1) activates transistors 316A and 316D, which thereby enables applying of the +V to the column sense line 302 via node 372 and also enables applying of the −V to the row sense line 303 via node 373. Therefore, both transistor 316A and 316D are turned on (conductive), and as such, writing of a data bit into the memory array is enabled. Further, when the data bit on line 345 is a one (1), that forces logic element 315, as an inverter, to output a zero (0), and because of the outputted zero (0), transistors 316B and 316C are turned off (non-conductive). Therefore nodes 372 and 373 are isolated from the sense amplifiers, 312 and 313, respectively.

Still with reference to FIG. 8, when a data bit having a binary value of zero (0) is to be written to memory element 325, via data bit input line 345, or when memory array 325 is being read, the inputted binary value of zero (0) at nodes 362 and 363 retain transistors 316A and 316D in an off or non-conductive state. This also isolates nodes 372 and 373 from +V and −V, respectively. The inputted zero is then outputted, via logic inverter 315, as a one (1), which in turn, turns on transistors 316B and 316C, making them conductive. Conduction of transistors 316B and 316C enables row sense line 303 to apply input to row sense amplifier 313 via node 373. It also enables column sense line 302 to apply input to column sense amplifier 312 via node 372. This causes nodes 372 and 373 to be held near ground, thereby disabling the writing of data bit one (1) to memory array 325. It should be appreciated that row sense amplifier 313, by being coupled in negative feedback, will hold node 373 at the mid-voltage. It should also be appreciated that column sense amplifier 312, by being coupled in negative feedback, will hold node 372 at the mid-voltage. Subsequently, a zero (0) remains in memory array 325, by virtue of not writing a one.

It is further appreciated that in another embodiment of the present invention, logic inverter 315 could be omitted, and transistors 316B and 316C could be made complimentary to the polarity of transistors 316A and 316D, effecting complimentary pairs of transistors, e.g., CMOS (complimentary metal oxide semiconductors), disposed within writing circuit 800 of FIG. 8. For example, transistors 316A and 316B would become a complimentary transistor pair and transistors 316C and 316D would also become a complimentary transistor pair. In this embodiment, one of each of the pairs of transistors (e.g., 316A and 316D) would be in an on-state (conductive) and the other (e.g., 316B and 316C) would be in an off-state (non-conductive), depending upon the value of the received inputted bit. It is also appreciated that each of the transistors with changed polarity, such as 316B and 316C would thus perform analogously to transistors 316B and 316C coupled with logic inverter 315, as described above.

Figure 9:
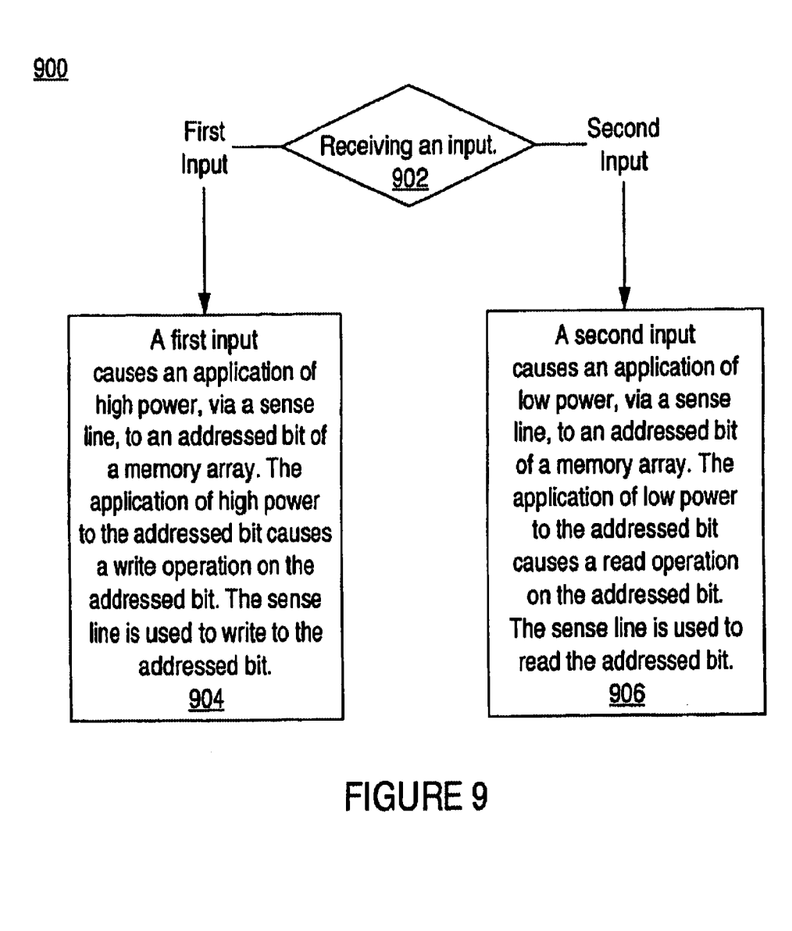
FIG. 9 is a flowchart of steps in a method for writing data bits to a memory array.

FIG. 9 is a flowchart 900 of steps performed in accordance with one embodiment of the present invention for providing a method of writing data bits to a crosspoint array. Flowchart 900 includes processes of the present invention which, in one embodiment, are carried out by processors and electrical components under the control of computer readable and computer executable instructions. The computer readable and computer executable instructions reside, for example, in data storage features such as computer usable volatile memory (RAM) and/or computer usable non-volatile memory (ROM). However, the computer readable and computer executable instructions may reside in any type of computer readable medium. Although specific steps are disclosed in flowchart 900, such steps are exemplary. That is, the present invention is well suited to performing various other steps or variations of the steps recited in FIG. 9. Within the present embodiment, it should be appreciated that the steps of flowchart 900 may be performed by software, by hardware or by any combination of software and hardware.

In step 902 of FIG. 9, an input is received. In one embodiment, the input is a one (1) or a zero (0). In one embodiment, the input is received via an input line, e.g., input line 345 of FIG. 8.

In step 904 of FIG. 9, a first input, in one embodiment a one (1), causes an application of a high power, via a sense line, e.g., sense lines 302 and 303 of FIG. 6, to an addressed bit of a memory array, e.g., address bit 320 of memory array 325. The high power applied to the addressed bit causes a write operation on the addressed bit. The sense line is utilized to write to the addressed bit.

In step 906 of FIG. 9, a second input, in one embodiment a zero (0), causes an application of a low power, via a sense line, e.g., sense lines 302 and 303 of FIG. 6, to an addressed bit of a memory array, e.g., address bit 320 of memory array 325. The low power applied to the addressed bit causes a read operation on the addressed bit. The sense line is utilized to write to the addressed bit.

It is appreciated that the order in which the first and second inputs are received are arbitrary, such that the second input can be received prior to receiving the first input, or vice-versa.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for writing a data bit to a memory array, said method comprising:

receiving a first input causing an application of high power, via a sense line, to an addressed bit in said memory array and causing a write operation on said addressed bit, and receiving a second input causing an application of low power, via said sense line, to said addressed bit and causing a read operation on said addressed bit, such that said sense line is used to read and write said addressed bit.

2. The method as recited in claim 1 further comprising addressing said addressed bit, via a plurality of address lines comprising a plurality of column address lines and a plurality of row address lines, provided said plurality of column address lines are high and said plurality of row address lines are low.

3. The method as recited in claim 1 further comprising isolating a second plurality of switches, subsequent to the receiving of said first input, wherein said second plurality of switches are in a non-conductive state.

4. The method as recited in claim 1 further comprising isolating a first plurality of switches, subsequent to the receiving of said second input, wherein said first plurality of switches are in a non-conductive state.

5. The method as recited in claim 1 further comprising holding a voltage, determined at a plurality of nodes coupled to a first plurality of switches and a second plurality of switches, at a mid-voltage level, such that a zero state of said addressed bit is unchanged, said mid-voltage level provided by a plurality of sense amplifiers, coupled to said sense line.

6. The method as recited in claim 1 further comprising changing a state of said addressed bit from a high resistance state to a low resistance state when said addressed bit is an anti-fuse.

7. The method as recited in claim 1 further comprises changing a state of said addressed bit from a low resistance state to a high resistance state when said addressed bit is a fuse.

8. The method as recited in claim 2 further comprising utilizing power-striping as part of said addressing of said addressed bit.

9. A system for writing a data bit to a memory array, said method comprising:

means for receiving a first input causing an application of high power to an addressed bit in said memory array, via a sense line, and causing a write operation on said addressed bit, and means for receiving a second input causing an application of low power to said addressed bit, via said sense line, and causing a read operation on said addressed bit, such that said sense line is used to read and write said addressed bit.

10. The system as recited in claim 9 further comprising a means for addressing said addressed bit, via a plurality of address lines comprising a plurality of column address lines and a plurality of row address lines, provided said plurality of said column address lines are high and said plurality of said row address lines are low.

11. The system as recited in claim 9 further comprising means for isolating a second plurality of switches, subsequent to the receiving of said first input, wherein said second plurality of switches are in a non-conductive state.

12. The system as recited in claim 9 further comprising means for isolating a first plurality of switches, subsequent to the receiving of said second input, wherein said first plurality of switches are in a non-conductive state.

13. The system as recited in claim 9 further comprising means for holding a voltage, determined at a plurality of nodes coupled to a first and a second plurality of switches, at a mid-voltage level, such that a zero state of said addressed bit is unchanged.

14. The system as recited in claim 9 further comprising means for changing a state of said addressed bit from a high resistance state to a low resistance state when said addressed bit is an anti-fuse.

15. The system as recited in claim 9 further comprises means for changing a state of said addressed bit from a low resistance state to a high resistance state when said addressed bit is a fuse.

16. The system as recited in claim 10 further comprising means for utilizing power-striping as part of said addressing of said addressed bit.

* * * * *